(12) United States Patent
Majima

(10) Patent No.: US 10,833,670 B2
(45) Date of Patent: Nov. 10, 2020

(54) SEMICONDUCTOR INTEGRATED CIRCUIT AND ADJUSTMENT METHOD FOR SEMICONDUCTOR INTEGRATED CIRCUIT

(71) Applicants: Kabushiki Kaisha Toshiba, Tokyo (JP); Toshiba Electronic Devices & Storage Corporation, Tokyo (JP)

(72) Inventor: Hideaki Majima, Minato Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/527,338

(22) Filed: Jul. 31, 2019

(65) Prior Publication Data
US 2020/0287531 A1    Sep. 10, 2020

(30) Foreign Application Priority Data

Mar. 6, 2019    (JP) .................................. 2019-040502

(51) Int. Cl.
*H03K 17/0812*    (2006.01)
*H03K 17/22*    (2006.01)
*H03K 17/16*    (2006.01)

(52) U.S. Cl.
CPC ..... *H03K 17/08128* (2013.01); *H03K 17/168* (2013.01); *H03K 17/223* (2013.01)

(58) Field of Classification Search
CPC ....... H01L 2924/00014; H01L 2924/00; H01L 21/78; H01L 21/304; H01L 2224/0239; H03K 17/0812; H03K 17/08128
See application file for complete search history.

(56) References Cited

U.S. PATENT DOCUMENTS

| | | | |
|---|---|---|---|
| 6,633,195 B2 | 10/2003 | Baudelot et al. | |
| 8,513,983 B2 | 8/2013 | Machida | |
| 9,515,649 B2 | 12/2016 | Abe | |
| 9,692,394 B1 * | 6/2017 | Agrawal | ................ H03K 3/012 |

FOREIGN PATENT DOCUMENTS

| | | |
|---|---|---|
| JP | 4968487 B2 | 7/2012 |
| JP | 5800986 B2 | 10/2015 |
| WO | 2015166523 A1 | 11/2015 |

\* cited by examiner

*Primary Examiner* — Sibin Chen
(74) *Attorney, Agent, or Firm* — White & Case LLP

(57) ABSTRACT

According to one embodiment, a semiconductor integrated circuit includes a normally-on type first switching element that has a source, a drain, and a gate, a normally-off type second switching element that has a drain that is connected to the source of the first switching element, a gate that is supplied with a driving signal, and a source, a resistor that is connected between the gate of the first switching element and the source of the second switching element, a first capacitor that is connected in parallel to the resistor, and a second capacitor between the gate and the source of the first switching element.

20 Claims, 5 Drawing Sheets

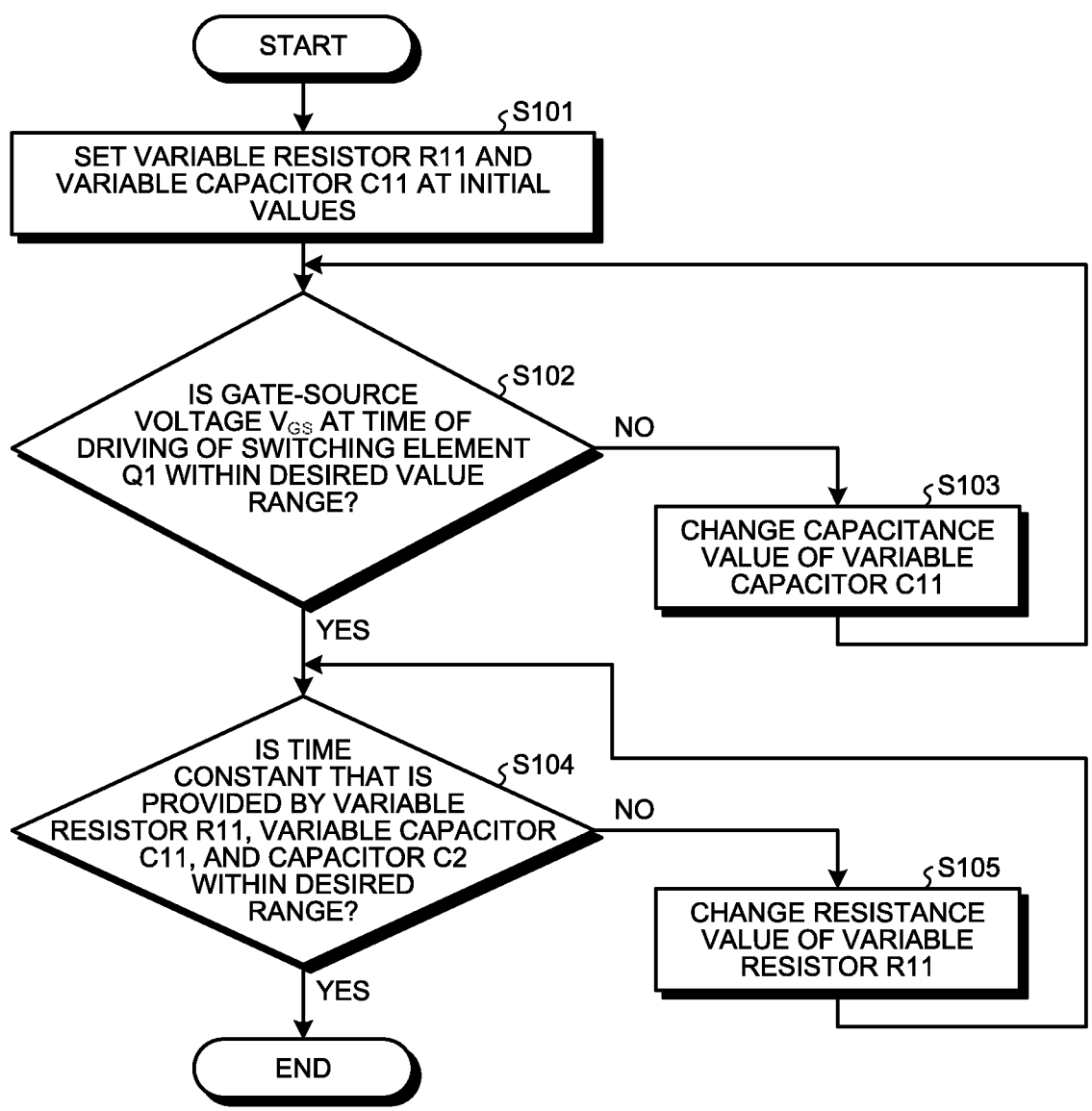

US 10,833,670 B2

SEMICONDUCTOR INTEGRATED CIRCUIT AND ADJUSTMENT METHOD FOR SEMICONDUCTOR INTEGRATED CIRCUIT

CROSS-REFERENCE TO RELATED APPLICATIONS

This application is based upon and claims the benefit of priority from Japanese Patent Application No. 2019-040502, filed on Mar. 6, 2019; the entire contents of which are incorporated herein by reference.

FIELD

The present embodiment generally relates to a semiconductor integrated circuit and an adjustment method for a semiconductor integrated circuit.

BACKGROUND

A semiconductor device which includes a normally-on type switching element and a normally-off type switching element that are cascode-connected to each other is disclosed conventionally. For example, a normally-on type switching element is composed of a transistor with a material that is gallium nitride (GaN) or silicon carbide (SiC). A normally-on type switching element that is composed of GaN or SiC is used to provide a semiconductor device with a high voltage resistance and a low loss. In a semiconductor device with such a configuration, a normally-off type switching element is turned on/off to turn on/off a normally-on type switching element.

Due to a characteristic of a normally-on type switching element that is in an on-state even in a state where a gate-source voltage is 0V, the normally-on type switching element is instantaneously turned on at a time when a normally-off type switching element is turned on, and a drain voltage thereof is shifted steeply. A steep shift of a drain voltage of a normally-on type switching element generates unnecessary radiation. Hence, a variety of attempts are executed to suppress a steep variation of a drain voltage of a normally-on type switching element at a time when a normally-off type switching element is turned on. A semiconductor integrated circuit and an adjustment method for a semiconductor integrated circuit are desired that utilize a characteristic of a semiconductor device that includes a normally-on type switching element and are capable of readily suppressing a steep shift of a drain voltage of the normally-on type switching element at a time when a normally-off type switching element is turned on/off.

BRIEF DESCRIPTION OF THE DRAWING(S)

FIG. 7 is a flowchart illustrating a control method for a semiconductor integrated circuit.

DETAILED DESCRIPTION

According to one embodiment, a semiconductor integrated circuit includes a normally-on type first switching element that has a source, a drain, and a gate, a normally-off type second switching element that has a drain that is connected to the source of the first switching element, a gate that is supplied with a driving signal, and a source, a resistor that is connected between the gate of the first switching element and the source of the second switching element, a first capacitor that is connected in parallel to the resistor, and a second capacitor between the gate and the source of the first switching element.

Hereinafter, a semiconductor integrated circuit and an adjustment method for a semiconductor integrated circuit according to embodiments will be explained in detail with reference to the accompanying drawings. Additionally, the present invention is not limited by such embodiments.

First Embodiment

Figure 1:
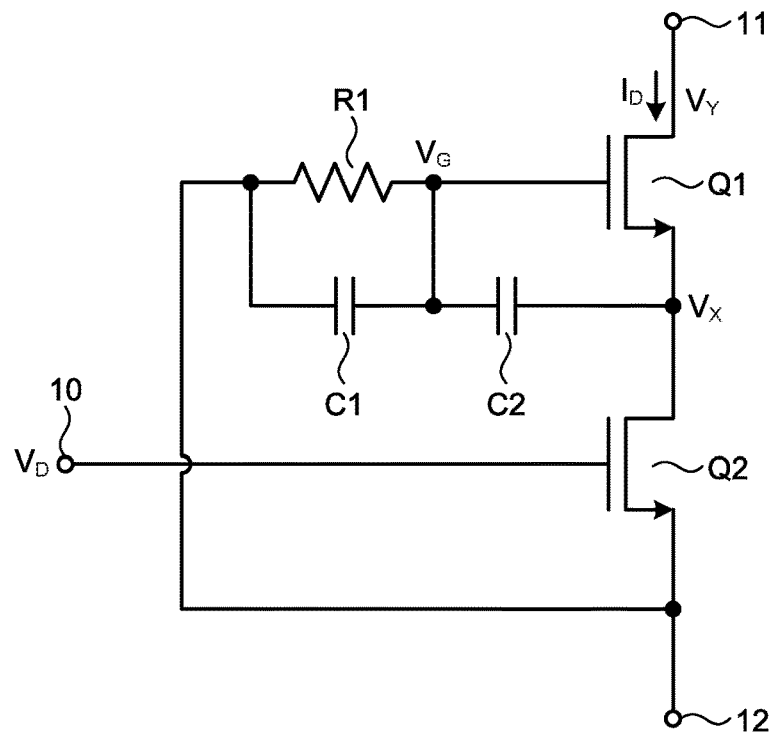
FIG. 1 is a diagram illustrating a semiconductor integrated circuit according to a first embodiment.

FIG. 1 is a diagram illustrating a semiconductor integrated circuit according to a first embodiment. A semiconductor integrated circuit according to the present embodiment has a normally-on type switching element Q1. The switching element Q1 is composed of, for example, an N-channel type MOS transistor with a material that is GaN. For example, a main current path between a drain and a source of a MOS transistor with a material that is GaN is composed of GaN. Hereinafter, it may be referred to as a GaN transistor.

A normally-off type switching element Q2 is composed of, for example, an N-channel type MOS transistor with a material that is Si. For example, a main current path between a drain and a source of the MOS transistor with a material that is Si is composed of Si. Hereinafter, it may be referred to as a Si transistor. A drain of the switching element Q1 is connected to a terminal 11. The terminal 11 is connected to, for example, a (non-illustrated) power source line where a voltage of 600V is applied thereto via (non-illustrated) another switching element. A source of the switching element Q1 is connected to a drain of the switching element Q2.

A source of the switching element Q2 is connected to a terminal 12. The terminal 12 is supplied with, for example, ground potential. A gate of the switching element Q2 is connected to a terminal 10. A driving signal $V_D$ is applied to the terminal 10.

A resistor R1 is connected between a gate of the switching element Q1 and the source of the switching element Q2. A capacitor C1 is connected in parallel to the resistor R1. A capacitor C2 is connected between the gate and the source of the switching element Q1. A common connection terminal for the capacitor C1 and the capacitor C2 is connected to the gate of the switching element Q1.

An operation in the present embodiment is as follows. As a driving signal $V_D$ that is applied to the gate of the switching element Q2 is High, the switching element Q2 is turned on. As the switching element Q2 is turned on, a drain voltage $V_X$ of the switching element Q2 is a voltage of the terminal 12, for example, ground potential.

A series circuit of the capacitor C1 and the capacitor C2 is charged with a voltage between the terminal 12 and the drain of the switching element Q2 when the switching element Q2 is in an off-state, that is, a drain voltage $V_X$. A sum of a voltage between both terminals of the capacitor C1 and a voltage between both terminals of the capacitor C2 is equal to a differential voltage between the terminal 12 and a drain voltage V. Additionally, when sufficient time has passed since the switching element Q2 is in an off-state, voltages at both terminals of the capacitor C1 are equal. Furthermore, a voltage between both terminals of C2 is equal to a differential voltage between the terminal 12 and a drain voltage $V_X$, so that an electric charge is stored depending on such a differential voltage.

As the switching element Q2 is turned on, a drain voltage $V_X$ of the switching element Q2 falls to a potential of the terminal 12, that is, ground potential. As a drain voltage $V_X$ of the switching element Q2 falls to ground potential, a gate voltage $V_G$ of the switching element Q1 drops. Thereby, a gate voltage $V_G$ of the switching element Q1 falls to a negative potential that is lower than ground potential.

When the switching element Q2 is turned on, a gate-source of the switching element Q1 is biased by a voltage between both terminals of the capacitor C2. As a drain voltage $V_X$ falls to ground potential, an electric charge that is stored in the capacitor C2 is redistributed between the capacitor C1 and the capacitor C2, so that a gate voltage $V_G$ of the switching element Q1 is changed by a capacitance ratio between the capacitor C1 and the capacitor C2. In other words, as capacitance values of the capacitor C1 and the capacitor C2 are selected, it is possible to adjust a gate voltage $V_G$ of the switching element Q1 at a time when the switching element Q2 is turned on or a gate-source voltage $V_{GS}$ of the switching element Q1.

An on-state of the normally-on type switching element Q1 is determined by a gate-source voltage $V_{GS}$. Therefore, it is possible to adjust an on-state of the normally-on type switching element Q1 by setting of capacitance values of the capacitor C1 and the capacitor C2.

For example, adjustment is executed in such a manner that a gate-source voltage $V_{GS}$ of the switching element Q1 at a time when the switching element Q2 is turned on is a value close to a threshold value of the switching element Q1, so that control is executed in such a manner that the switching element Q1 is in a weak on-state. Furthermore, when the switching element Q2 is turned on, the switching element Q1 is not in an off-state but is in a strong on-state, so that it is possible to decrease a delay of a response of the switching element Q1. A more detailed method of adjustment will be described later.

As the switching element Q2 is turned on, a state is provided where the drain and the source of the switching element Q2 are connected substantially, so that a CR circuit that is provided by a parallel connection of the capacitor C1 and the capacitor C2 and the resistor R1 is provided between the drain and the source of the switching element Q2. Hence, a gate voltage $V_G$ of the switching element Q1 is changed depending on a time constant ($\tau = C \times R$) of a CR circuit that is composed of a parallel connection of the capacitor C1 and the capacitor C2 and the resistor R1. More specifically, a gate voltage $V_G$ of the switching element Q1 provides a transition from a voltage that has dropped by a voltage that is shared by the capacitor C2 at a time when the switching element Q2 is turned on to a potential of the terminal 12, for example, ground potential, depending on a time constant of a CR circuit that is provided by a parallel connection of the capacitor C1 and the capacitor C2 and the resistor R1.

Thereby, it is possible to adjust a value of a gate voltage $V_G$ of the switching element Q1 at a time when the switching element Q2 is turned on and a shift thereof, by capacitance values of the capacitors C1 and C2 and a resistance value of the resistor R1.

When a gate-source voltage $V_{GS}$ of the switching element Q1 is close to 0V, the switching element Q1 is in a complete on-state and an on-resistance thereof is small. Therefore, as a gate-source voltage $V_{GS}$ is instantaneously changed from an off-state where a gate-source voltage $V_{GS}$ of the switching element Q1 is lower than a threshold value to 0V, a change of the drain voltage $V_X$ of the switching element Q2 is instantaneously reflected in a drain voltage $V_Y$ of the switching element Q1. That is, a drain voltage $V_Y$ of the switching element Q1 is changed steeply.

On the other hand, when a gate-source voltage $V_{GS}$ of the switching element Q1 is a voltage close to a threshold value, the switching element Q1 is in a weak on-state and an on-resistance thereof is large. Adjustment is executed in such a manner that when the switching element Q2 is turned on, a gate-source voltage $V_{GS}$ of the switching element Q1 is a voltage close to a threshold value to provide a weak on-state, and a gate voltage $V_G$ of the switching element Q1 is gently changed by a time constant of a CR circuit that is composed of a parallel connection of the capacitor C1 and the capacitor C2 and the resistor R1 to change a gate-source voltage $V_{GS}$ of the switching element Q1 gently and provides a gentle transition of the switching element Q1 to a strong on-state, so that it is possible to mitigate a steep variation of a drain voltage $V_Y$ of the switching element Q1.

According to the present embodiment, a series circuit of the capacitor C1 and the capacitor C2 is provided between the source of the switching element Q1 and the source of the switching element Q2 and a common connection terminal thereof is connected to the gate of the switching element Q1, so that it is possible to adjust a gate-source voltage $V_{GS}$ of the switching element Q1 at a time when the switching element Q2 is turned on. That is, it is possible to readily adjust an on-state of the switching element Q1 by adjustment of a gate-source voltage $V_{GS}$ of the switching element Q1.

Furthermore, a transition of a gate-source voltage $V_{GS}$ of the switching element Q1 is provided according to a time constant of a CR circuit that is composed of the resistor R1 that is connected to the gate of the switching element Q1, the capacitor C1, and the capacitor C2, so that it is possible to change the switching element Q1 from a weak on-state to a strong on-state gently. Thereby, it is possible to suppress a steep variation of a drain voltage $V_Y$ of the switching element Q1, so that it is possible to suppress generation of unnecessary radiation that is caused at a time when the switching element Q2 is in an on-state in response to a driving signal $V_D$.

Figure 2:
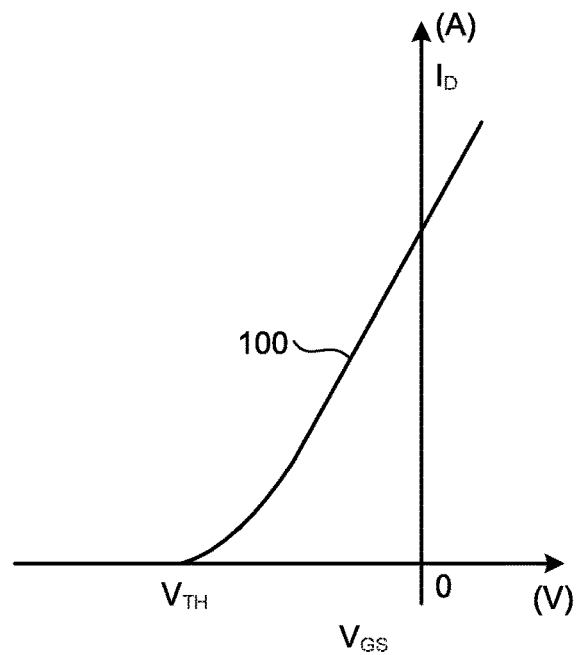
FIG. 2 is a diagram illustrating a characteristic of a normally-on type switching element.

FIG. 2 is a diagram illustrating a characteristic of a normally-on type switching element. A characteristic of the switching element Q1 in the first embodiment as already described is illustrated. A horizontal axis represents a gate-source voltage $V_{GS}$ and a vertical axis represents a drain current $I_D$. A characteristic curve 100 is illustrated in such a manner that a drain current $I_D$ flows even when a gate-source voltage $V_{GS}$ is zero (0) V and a drain current $I_D$ is approximately zero (0) A at a time when a gate-source voltage $V_{GS}$ is a threshold value $V_{TH}$ that is minus.

In the first embodiment as already described, a gate-source voltage $V_{GS}$ of the switching element Q1 at a time when the switching element Q2 is turned on is adjusted by adjustment of capacitance values of the capacitor C1 and the capacitor C2, so that it is possible to adjust an on-state of the switching element Q1. For example, adjustment is executed in such a manner that a gate-source voltage $V_{GS}$ of the switching element Q1 at a time when the switching element Q2 is turned on is a value close to a threshold value $V_{TH}$, so that it is possible to transfer the switching element Q1 to a weak on-state.

Figure 3:
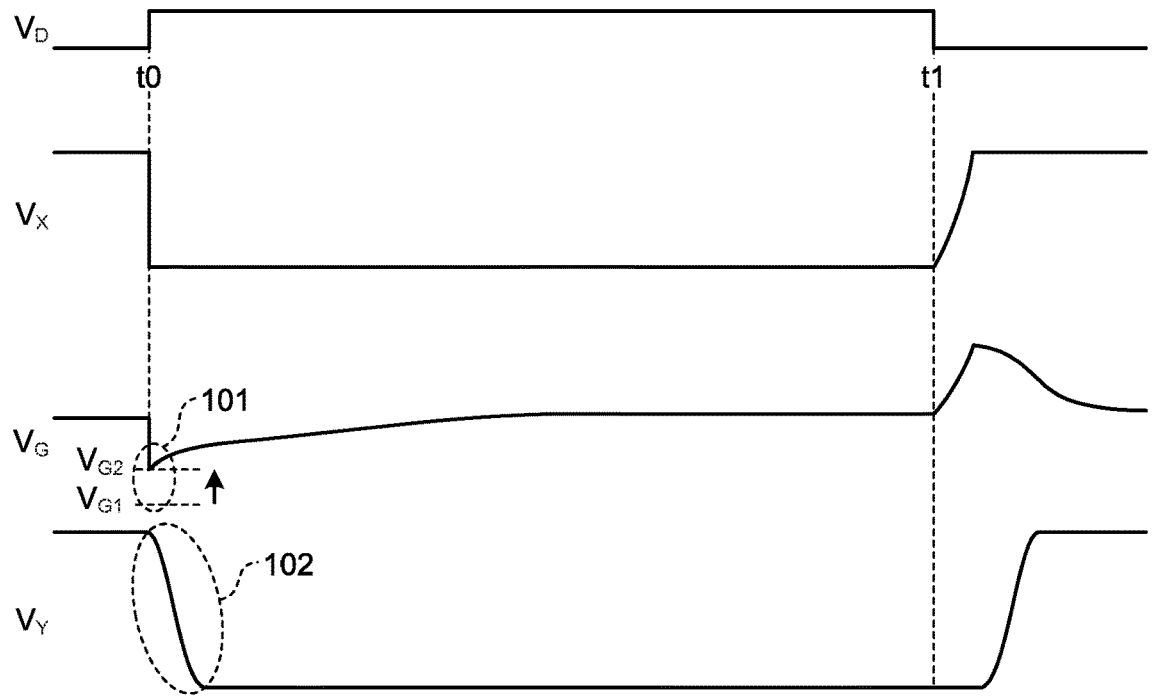
FIG. 3 is a diagram illustrating a result of simulation.

FIG. 3 is a diagram illustrating a result of simulation. A driving signal $V_D$ that is applied to the gate of the switching element Q2, a drain voltage $V_X$ of the switching element Q2, a gate voltage $V_G$ of the switching element Q1, and a drain voltage $V_Y$ of the switching element Q1 are illustrated from an upper side.

As a driving signal $V_D$ is High at timing t0, the switching element Q2 is turned on and a drain voltage $V_X$ falls steeply. A gate voltage $V_G$ also falls. Therefore, in a case where, for example, ground potential is applied to the terminal 12 that is connected to the source of the switching element Q2, a gate voltage $V_G$ is a negative voltage.

In a configuration to divide a drain voltage $V_X$ of the switching element Q2 by a series connection of the capacitor C1 and the capacitor C2, a capacitance ratio between the capacitor C1 and the capacitor C2 is adjusted appropriately, so that it is possible to readily execute adjustment to raise a gate voltage $V_G$ of the switching element Q1 at a time when the switching element Q2 is turned on from a voltage $V_{G1}$ to a voltage $V_{G2}$, as indicated by a broken ellipse 101.

A value of a voltage $V_{G2}$ is set at, for example, a voltage close to a threshold value $V_{TH}$ of the switching element Q1, so that it is possible to provide a weak on-state of the switching element Q1 immediately after the switching element Q2 is turned on. A gate voltage $V_G$ of the switching element Q1 provides a transition to a potential of the terminal 12, that is, ground potential according to a time constant of a CR circuit that is connected to the gate of the switching element Q1 and composed of the resistor R1, the capacitor C1, and the capacitor C2.

The switching element Q1 is gently transferred from a weak on-state to a strong on-state according to a CR time constant, so that a steep change of a drain voltage $V_Y$ of the switching element Q1 at a time when the switching element Q2 is turned on is suppressed. That is, it is possible to mitigate a change ($dV_Y/dt$) of a drain voltage $V_Y$ of the switching element Q1, as indicated by a dashed ellipse 102, relative to a change of a drain voltage $V_X$ of the switching element Q2 that responds to a driving signal $V_D$ that is applied to the gate of the switching element Q2. Thereby, a steep voltage variation of a wiring that is connected to the drain of the switching element Q1 is suppressed, so that generation of unnecessary radiation is suppressed.

As a driving signal $V_D$ is Low at timing t1, the switching element Q2 is turned off, so that a drain voltage $V_X$ of the switching element Q2 and a drain voltage $V_Y$ of the switching element Q1 rise.

Second Embodiment

Figure 4:
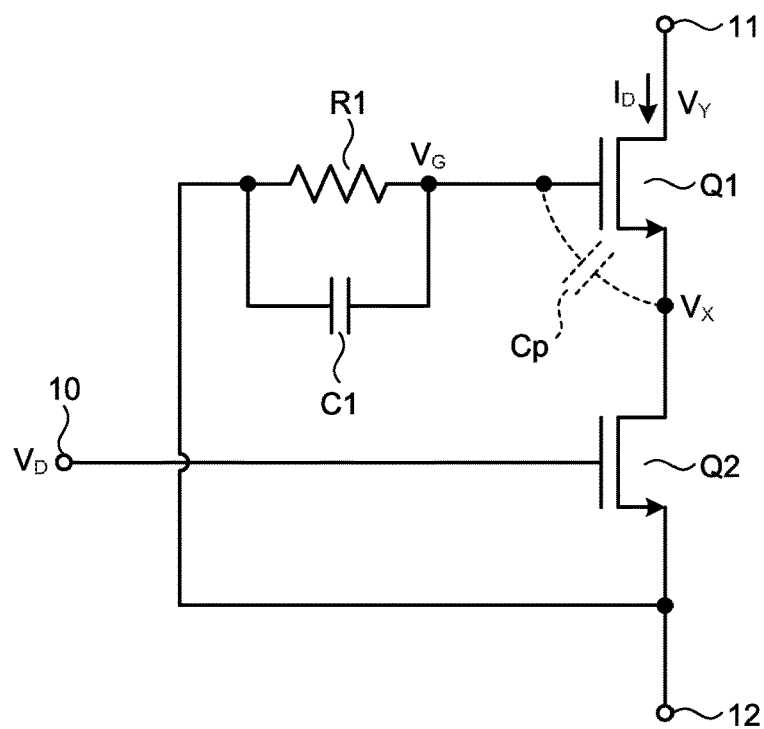
FIG. 4 is a diagram illustrating a semiconductor integrated circuit according to a second embodiment.

FIG. 4 is a diagram illustrating a semiconductor integrated circuit according to a second embodiment. A component that corresponds to that of the embodiment as already described is provided with an identical sign and a redundant description is provided only in case of need. Hereinafter, the same applies.

In the present embodiment, a parasitic capacitor Cp of the switching element Q1 is used as a capacitor that is connected to the capacitor C1 in series.

In the present embodiment, a gate voltage $V_G$ of the switching element Q1 at a time when the switching element Q2 is turned on is adjusted by a capacitance ratio between the capacitor C1 that is connected to the resistor R1 in parallel and the parasitic capacitor Cp.

A gate voltage $V_G$ of the switching element Q1 at a time when the switching element Q2 is turned on is adjusted by setting of a capacitance ratio between the capacitor C1 and the parasitic capacitor Cp to adjust a gate-source voltage $V_{GS}$ of the switching element Q1, so that it is possible to adjust an on-state of the switching element Q1. For example, adjustment is executed in such a manner that a gate-source voltage $V_{GS}$ of the switching element Q1 at a time when the switching element Q2 is turned on is a value close to a threshold value $V_{TH}$, so that it is possible to execute adjustment to provide a weak on-state of the switching element Q1.

Furthermore, a gentle transition of a gate voltage $V_G$ of the switching element Q1 is provided according to a time constant of an CR circuit that is composed of the resistor R1, the capacitor C1, and the parasitic capacitor Cp, so that it is possible to transfer the switching element Q1 from a weak on-state to a strong on-state gently. Thereby, a steep change of a drain voltage $V_Y$ of the switching element Q1 a time when the switching element Q2 is turned on is suppressed, so that a steep voltage variation of a wiring that is connected to the drain of the switching element Q1 is suppressed and generation of unnecessary radiation is suppressed.

Third Embodiment

Figure 5:
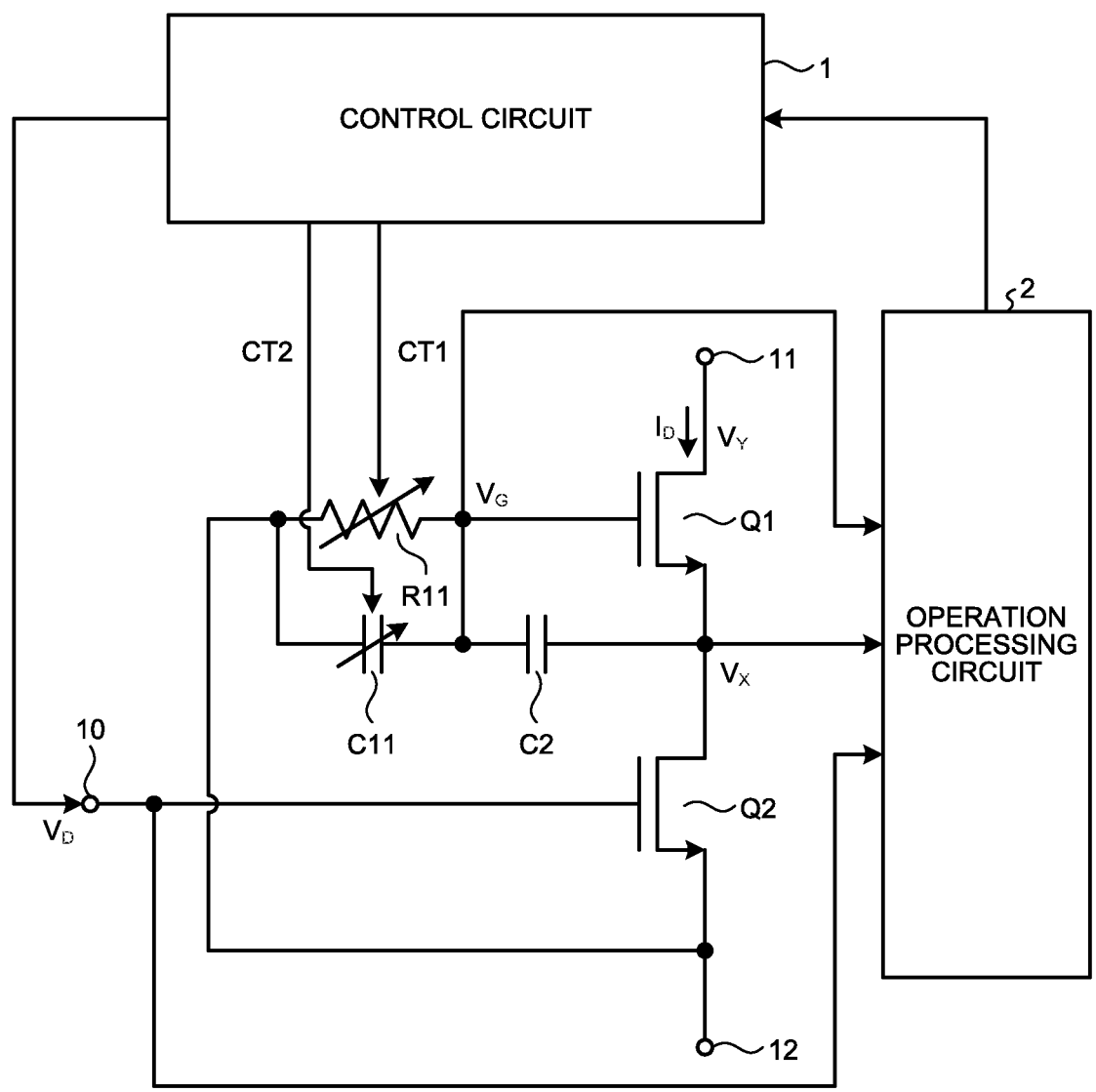
FIG. 5 is a diagram illustrating a semiconductor integrated circuit according to a third embodiment.

FIG. 5 is a diagram illustrating a semiconductor integrated circuit according to a third embodiment. In the present embodiment, a variable resistor R11 is connected between the gate of the switching element Q1 and the source of the switching element Q2 and a variable capacitor C11 is connected to the variable resistor R11 in parallel.

Values of a resistance of the variable resistor R11 and a capacitance of the variable capacitor C11 are controlled by a control signal from a control circuit 1. It is possible to provide the variable resistor R11 with, for example, a configuration to connect parallel connections of a (non-illustrated) resistor and a (non-illustrated) switch at multistage and in series, control on/off of such a switch by a control signal from the control circuit 1, and change the number of resistors that are connected in series. That is, a resistance value of the variable resistor R11 is associated with the number of switches that are turned on/off according to a control signal from the control circuit 1, so that it is possible to adjust a resistance value of the variable resistor R11 to a desired value.

It is possible to provide the variable capacitor C11 with, for example, a configuration to connect serial connections of a (non-illustrated) capacitor and a (non-illustrated) switch at multistage and in parallel, control on/off of such a switch by a control signal from the control circuit 1, and change the number of capacitors that are connected in parallel. That is, a capacitance value of the variable capacitor C11 is associated with the number of switches that are turned on/off according to a control signal from the control circuit 1, so that it is possible to adjust a capacitance value of the variable capacitor C11 to a desired value.

Predetermined voltages are applied to the terminal 11 and the terminal 12. For example, 600V is applied to the terminal 11, and for example, ground potential is applied to the terminal 12. A driving signal $V_D$ from the control circuit 1 is supplied to the terminal 10.

A drain voltage $V_X$ of the switching element Q2 and a gate voltage $V_G$ of the switching element Q1 are supplied to an operation processing circuit 2. The operation processing circuit 2 calculates a gate-source voltage $V_{GS}$ of the switching element Q1 based on values of a drain voltage $V_X$ of the switching element Q2 and a gate voltage $V_G$ of the switching element Q1 at a time when a driving signal $V_D$ is High. For example, a calculated gate-source voltage $V_{GS}$ is compared with a value that is preliminarily stored in the operation processing circuit 2 as a desired gate-source voltage $V_{GS}$ and an instruction value to change a resistance value of the variable capacitor C11 in such a manner that a gate-source voltage $V_{GS}$ of the switching element Q1 at a time when a driving signal $V_D$ is High is a desired gate-source voltage $V_{GS}$ is supplied to the control circuit 1. For a gate-source voltage $V_{GS}$ of the switching element Q1 at a time when a driving signal $V_D$ that is supplied to the gate of the switching element Q2 is High, that is, a time when the switching element Q2 is turned on, it is possible to provide any value between a voltage value provided by inverting a sign of a maximum value of a preliminarily stored drain voltage $V_X$ and 0V. For example, it is possible to adjust a gate-source voltage $V_{GS}$ of the switching element Q1 at a time when the switching element Q2 is turned on to any value between a value near a threshold value that is slightly less than the threshold value and 0V. It is possible to provide the operation processing circuit 2 with a configuration to install a program that is based on a variety of control algorithms that define timing of application of a driving signal $V_D$ to the switching element Q2, timing of changing of a resistance value of the variable resistor R11 or a capacitance value of the variable capacitor C11, and the like.

The control circuit 1 changes a capacitance value of the variable capacitor C11 by a control signal CT2 to control a capacitance value of the variable capacitor C11 in response to an instruction value from the operation processing circuit 2. In such a configuration, it is possible to adjust a gate-source voltage $V_{GS}$ of the switching element Q1 at a time when the switching element Q2 is turned on to a desired value by capacitance values of the variable capacitor C11 and the capacitor C2.

Furthermore, the operation processing circuit 2 supplies an instruction value to change a resistance value of the variable resistor R11 to the control circuit 1. A resistance value of the variable resistor R11 is adjusted by the control circuit 1, so that it is possible to adjust a time constant of a CR circuit that is composed of a parallel circuit of the variable resistor R11, the variable capacitor C11, and the capacitor C2. A time constant is adjusted, so that it is possible to adjust a transition of a gate-source voltage $V_{GS}$ of the switching element Q1, that is, a period of time when a transition of a gate voltage $V_G$ immediately after the switching element Q2 is turned on to a voltage of the terminal 12 is provided.

For example, as a time constant is increased, a period of time when a gate voltage $V_G$ reaches a voltage of the terminal 12 is increased, so that a period of time until the switching element Q1 turns into an on-state completely is increased. That is, it is possible to mitigate a change of a drain voltage $V_Y$ of the switching element Q1.

The operation processing circuit 2 supplies, for example, an instruction value to change a resistance value of the variable resistor R11 depending on a change of a capacitance value of the variable capacitor C11, to the control circuit 1. For example, an instruction value to change a resistance value of the variable resistor R11 in such a manner that time constants of a CR circuit that is composed of the variable resistor R11, the variable capacitor C11, and the capacitor C2 before and after a capacitance value of the variable capacitor C11 is changed are identical is supplied to the control circuit 1. Alternatively, a time constant that is provided by the variable resistor R11, the variable capacitor C11, and the capacitor C2 after a capacitance value of the variable capacitor C11 is changed may be compared with a setting value that is stored in the operation processing circuit 2 as a preliminarily desired value of a time constant and an instruction value to change a resistance value of the variable resistor R11 in such a manner that the time constant that is provided by the variable resistor R11, the variable capacitor C11, and the capacitor C2 is such a desired value of a time constant may be supplied to the control circuit 1. The control circuit 1 changes a resistance value of the variable resistor R11 by a control signal CT1 to change a resistance value of the variable resistor R11 in response to an instruction value from the operation processing circuit 2.

Additionally, the capacitor C2 may be composed of a variable capacitor. As the capacitor C2 is a variable capacitor, a degree of freedom of setting of a capacitance ratio between the capacitor C2 and the variable capacitor C11 is increased, so that it is possible to improve a degree of freedom at a time when a gate voltage $V_G$ of the switching element Q1 is adjusted.

Figure 6:
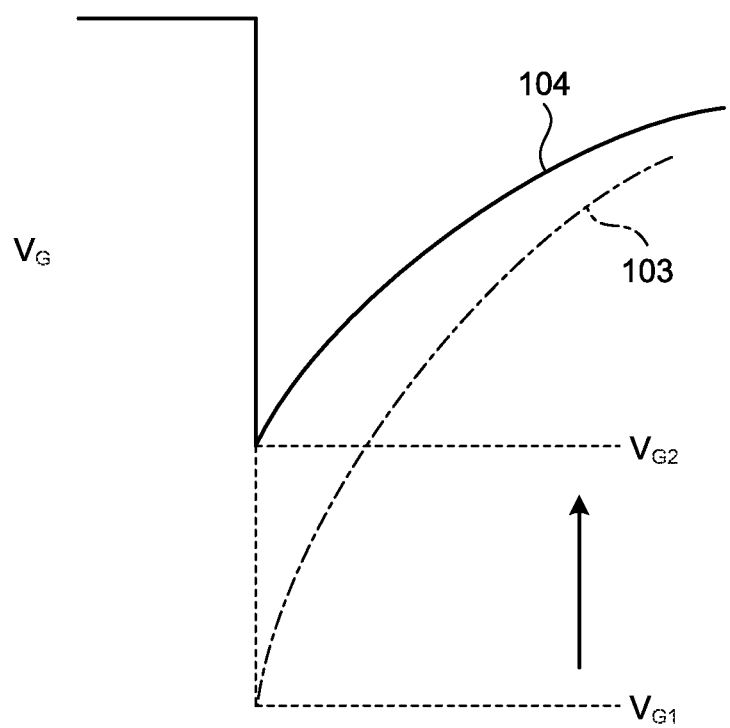
FIG. 6 is a diagram for explaining a control method for a semiconductor integrated circuit.

FIG. 6 is a diagram for explaining an adjustment method for a semiconductor integrated circuit where a gate voltage $V_G$ of the switching element Q1 is illustrated schematically. An adjustment method in FIG. 6 is used for, for example, adjustment of a gate-source voltage $V_{GS}$ of the switching element Q1 in the embodiment as illustrated in FIG. 5.

It is possible to adjust a value of a gate voltage $V_G$ at a time when a driving signal $V_D$ is High by setting of a capacitance ratio between the variable capacitor C11 and the capacitor C2. That is, it is possible to adjust a gate voltage $V_G$ from a transition according to a dashed-dotted line 103 to a transition as indicated by a solid line 104. Specifically, a capacitance value of the variable capacitor C11 relative to that of the capacitor C2 is increased. A voltage that is shared by the capacitor C2 at a time when the switching element Q2 is turned on is decreased, so that it is possible to execute adjustment to raise a value of a gate voltage $V_G$ of the switching element Q1 from the voltage $V_{G1}$ to the voltage $V_{G2}$.

A gate voltage $V_G$ of the switching element Q1 at a time when the switching element Q2 is turned on is adjusted by a ratio between capacitance values of the variable capacitor C11 and the capacitor C2 to adjust a gate-source voltage $V_{GS}$ of the switching element Q1, so that it is possible to adjust an on-state of the switching element Q1 at the time when the switching element Q2 is turned on.

Specifically, as a gate-source voltage $V_{GS}$ of the switching element Q1 is higher than a threshold value $V_{TH}$ and is a value close to the threshold value $V_{TH}$, so that it is possible to provide a weak on-state of the switching element Q1 at a time when the switching element Q2 is turned on. Additionally, "higher than a threshold value $V_{TH}$" as mentioned herein means that the switching element Q1 is a normally-on type and such a threshold value $V_{TH}$ is a negative voltage, so that a value of a voltage on a plus side of a threshold value $V_{TH}$ is provided.

Fourth Embodiment

FIG. 7 is a diagram illustrating a flowchart of an adjustment method for a semiconductor integrated circuit. For example, it is used in the embodiment as illustrated in FIG. 5. The variable resistor R11 and the variable capacitor C11 are set at initial values (step S101). The capacitor C2 has a fixed capacitance.

Whether or not a gate-source voltage $V_{GS}$ of the switching element Q1 at a time of driving of the switching element Q1, that is, a time when a driving signal $V_D$ that is applied to the gate of the switching element Q2 is High is within a desired value range is determined (step S102). For example, it is possible to detect a gate-source voltage $V_{GS}$ of the switching element Q1 from values of a drain voltage $V_X$ of the switching element Q2 and a gate voltage $V_G$ of the switching element Q1 at a time when a driving signal $V_D$ that is applied to the gate of the switching element Q2 is High.

For example, whether or not a gate-source voltage $V_{GS}$ of the switching element Q1 is within a desired range between a threshold value $V_{TH}$ and 0V is determined. In a case where a gate-source voltage $V_{GS}$ of the switching element Q1 is not a value between a threshold value $V_{TH}$ and 0V and is not within a desired value range (step S102: No), a capacitance value of the variable capacitor C11 is changed (step S103). Application of a driving signal $V_D$, detection of a gate-source voltage $V_{GS}$ of the switching element Q1, and a change of a capacitance value of the variable capacitor C11 based on a result of such detection are executed so that a capacitance value of the variable capacitor C11 is changed until the gate-source voltage $V_{GS}$ of the switching element Q1 at a time when the driving signal $V_D$ is High falls within a desired range. Additionally, a case where a gate-source voltage $V_{GS}$ is not within a desired range is, for example, a case where a gate voltage $V_G$ of the switching element Q1 at a time when the switching element Q2 is turned on falls and a gate-source voltage $V_{GS}$ is lower than a value of a threshold value $V_{TH}$. Additionally, "lower than a threshold value $V_{TH}$" as mentioned herein means that the switching element Q1 is a normally-on type and such a threshold value $V_{TH}$ is a negative voltage, so that a value of a voltage on a minus side of the threshold value $V_{TH}$ is provided.

In a case where a gate-source voltage $V_{GS}$ of the switching element Q1 at a time when a driving signal $V_D$ is High is within a desired range (step S102: Yes), whether or not a time constant that is provided by the variable resistor R11, the variable capacitor C11, and the capacitor C2 is within a desired range is determined (step S104). As a time constant is increased, a change of a gate-source voltage $V_{GS}$ is gentle, so that it is possible to turn on the switching element Q1 gently in a case where a driving signal $V_D$ is changed from Low to High and it is possible to suppress generation of unnecessary radiation that is caused by a steep change of a drain voltage $V_Y$ of the switching element Q1.

On the other hand, as a time constant is increased, an operation speed of a semiconductor integrated circuit falls. Therefore, it is possible to suppress generation of unnecessary radiation that is involved with a steep change of a drain voltage $V_Y$ of the switching element Q1 and set a desired time constant by taking an operation speed of a semiconductor integrated circuit into consideration. A resistance value of the variable resistor R11 may be changed so as to provide an initially set time constant depending on a change of a capacitance value of the variable capacitor C11.

Additionally, in a case where a driving signal $V_D$ that is applied to the gate of the switching element Q2 is switched from High to Low, that is, a case where the switching element Q2 is switched from on to off, adjustment to decrease a resistance value of the variable resistor R11 so as to decrease a time constant may be executed. As a time constant is decreased, it is possible to decrease a delay of a change of a drain voltage $V_Y$ of the switching element Q1, that is, a delay of an operation of the switching element Q1.

That is, when the switching element Q2 is turned on, a resistance value of the variable resistor R11 is increased to increase a time constant, and when the switching element Q2 is turned off, a resistance value of the variable resistor R11 is decreased to decrease a time constant, so that it is possible to provide a configuration to suppress a steep variation of a drain voltage $V_Y$ of the switching element Q1 at a time when the switching element Q2 is turned on so as to suppress generation of unnecessary radiation and to decrease a delay of an operation of the switching element Q1 at a time when the switching element Q2 is turned off.

Additionally, it is possible to execute control to increase a resistance value of the variable resistor R11, for example, at any timing immediately after a gate-source voltage $V_{GS}$ of the switching element Q1 is greater than a threshold value $V_{TH}$ to provide an off-state of the switching element Q1 and immediately before the switching element Q1 is in an on-state.

Furthermore, it is possible to execute control to decrease a resistance value of the variable resistor R11, for example, at any timing immediately after a gate-source voltage $V_{GS}$ of the switching element Q1 is 0V to provide a complete on-state of the switching element Q1 and immediately before the switching element Q1 is in an off-state.

In a case where a time constant that is provided by the variable resistor R11, the variable capacitor C11, and the capacitor C2 is within a desired range (step S104: Yes), ending is executed. In a case where it is not within a desired range (step S104: No), an operation to change a resistance value of the variable resistor R11 is continued (step S105).

Due to an adjustment method according to the present embodiment, a gate voltage $V_G$ of the switching element Q1 at a time when the switching element Q2 is turned on is adjusted by adjustment of capacitance values of the variable capacitor C11 and the capacitor C2, therefore, a gate-source voltage $V_{GS}$ is adjusted, and a resistance value of the variable resistor R11 is further adjusted, so that it is possible to adjust a time constant of a CR circuit that is composed of the variable resistor R11, the variable capacitor C11, and the capacitor C2 to a desired value. Thereby, it is possible to readily execute adjustment to gently change the switching element Q1 at a time when the switching element Q2 is turned on from a weak on-state to a strong on-state. Thereby, a steep change of a drain voltage $V_Y$ of the switching element Q1 is suppressed, so that it is possible to readily execute adjustment to suppress generation of unnecessary radiation. Furthermore, it is also possible to readily execute adjustment of a delay of an operation of the switching element Q1 at a time when the switching element Q2 is switched from an on-state to an off-state by adjustment of a time constant of a CR circuit that is composed of the variable resistor R11, the variable capacitor C11, and the capacitor C2.

Additionally, the normally-on type switching element Q1 according to the embodiment as already described may be composed of a Junction Field Effect Transistor (JFET).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a normally-on type first switching element that has a source, a drain, and a gate;
   a normally-off type second switching element that has a drain that is connected to the source of the first switching element, a gate that is supplied with a driving signal, and a source;

a resistor with a first end connected to the gate of the first switching element and a second end connected to the source of the second switching element;
a first capacitor with a first electrode connected to the first end of the resistor and a second electrode connected to the second end of the resistor; and
a second capacitor between the gate and the source of the first switching element,
wherein a voltage at the first end of the resistor is applied to the gate of the first switching element, and the voltage is adjusted by a capacitance ratio between the first capacitor and the second capacitor.

2. The semiconductor integrated circuit according to claim 1, wherein the first capacitor has a variable capacitor.

3. The semiconductor integrated circuit according to claim 2, comprising a control circuit that controls a capacitance value of the first capacitor.

4. The semiconductor integrated circuit according to claim 3, comprising an operation processing circuit that supplies the control circuit with an instruction value to change the capacitance value of the first capacitor based on a result of comparing a gate-source voltage of the first switching element at a time when the second switching element is turned on with a desired voltage value.

5. The semiconductor integrated circuit according to claim 2, wherein the resistor has a variable resistor.

6. The semiconductor integrated circuit according to claim 2, wherein the second capacitor is composed of a parasitic capacitor between the gate and the source of the first switching element.

7. The semiconductor integrated circuit according to claim 1, wherein the resistor has a variable resistor.

8. The semiconductor integrated circuit according to claim 7, comprising a control circuit that controls a resistance value of the resistor.

9. The semiconductor integrated circuit according to claim 8, comprising an operation processing circuit that supplies the control circuit with an instruction value to change the resistance value of the resistor in such a manner that a time constant that is provided by the resistance value of the resistor and a capacitance value of the first capacitor is identical between before the capacitance value of the first capacitor is changed and after it is changed.

10. The semiconductor integrated circuit according to claim 1, wherein the second capacitor is composed of a parasitic capacitor between the gate and the source of the first switching element.

11. The semiconductor integrated circuit according to claim 1, wherein the second capacitor has a variable capacitor.

12. An adjustment method for a semiconductor integrated circuit including:
a normally-on type first switching element that has a source, a drain, and a gate;
a normally-off type second switching element that has a drain that is connected to the source of the first switching element, a gate that is supplied with a driving signal, and a source;
a resistor that is connected between the gate of the first switching element and the source of the second switching element;
a first capacitor that is connected in parallel to the resistor; and
a second capacitor between the gate and the source of the first switching element, comprising
a step of adjusting a capacitance value of the first capacitor depending on a gate-source voltage of the first switching element at a time when the driving signal to turn on the second switching element is applied to the gate of the second switching element.

13. The adjustment method for a semiconductor integrated circuit according to claim 12, wherein the step of adjusting a capacitance value of the first capacitor includes a step of adjusting a capacitance value of the first capacitor in such a manner that the gate-source voltage of the first switching element at a time when the driving signal to turn on the second switching element is applied to the gate of the second switching element is a value near a threshold value of the first switching element or a value less than the threshold value.

14. The adjustment method for a semiconductor integrated circuit according to claim 12, comprising a step of detecting a gate voltage of the first switching element and a drain voltage of the second switching element at a time when the driving signal to turn on the second switching element is applied to the gate of the second switching element.

15. The adjustment method for a semiconductor integrated circuit according to claim 12, comprising a step of adjusting a resistance value of the resistor in response to the driving signal.

16. The adjustment method for a semiconductor integrated circuit according to claim 15, comprising a step of adjusting a resistance value of the resistor in such a manner that a time constant that is provided by the capacitance value of the first capacitor and the resistance value of the resistor is equal to a time constant that is provided by the capacitance value of the first capacitor and the resistance value of the resistor before the capacitance value of the first capacitor is adjusted.

17. The adjustment method for a semiconductor integrated circuit according to claim 15, comprising a step of comparing a time constant that is provided by the capacitance value of the first capacitor and the resistance value of the resistor with a preliminarily set time constant and adjusting the resistance value of the resistor depending on a result of such comparison.

18. The adjustment method for a semiconductor integrated circuit according to claim 15, comprising:
a step of increasing the resistance value of the resistor at a time when the second switching element is switched from an off-state to an on-state; and
a step of decreasing the resistance value of the resistor at a time when the second switching element is switched from the on-state to the off-state.

19. The adjustment method for a semiconductor integrated circuit according to claim 15, comprising a step of increasing the resistance value of the resistor after the first switching element is switched to an off-state.

20. The adjustment method for a semiconductor integrated circuit according to claim 15, comprising a step of decreasing the resistance value of the resistor after the first switching element is switched to an on-state.

* * * * *